US 6,625,010 B2

(12) United States Patent
Chen et al.

(10) Patent No.: US 6,625,010 B2
(45) Date of Patent: Sep. 23, 2003

(54) TOWER NETWORK APPARATUS

(75) Inventors: Sheng-Chung Chen, Ping-Tung Hsien (TW); Tai-Tung Lien, Miao-Li Hsien (TW)

(73) Assignee: Accton Technology Corporation, Hsinchu (TW)

( * ) Notice: Subject to any disclaimer, the term of this patent is extended or adjusted under 35 U.S.C. 154(b) by 26 days.

(21) Appl. No.: 10/109,264

(22) Filed: Mar. 28, 2002

(65) Prior Publication Data

US 2003/0100221 A1 May 29, 2003

(30) Foreign Application Priority Data

Nov. 29, 2001 (TW) ........................................ 90220675 U

(51) Int. Cl.$^7$ ................................................ H05K 5/05
(52) U.S. Cl. .................... 361/679; 312/223.2; 235/380; 379/434; 429/97
(58) Field of Search ................................. 361/679–687, 361/724–727; 312/223.1–223.6; 235/380, 462.43, 462.45; 379/433, 434; 429/96–100

(56) References Cited

U.S. PATENT DOCUMENTS

| | | | | |
|---|---|---|---|---|
| 5,555,157 A | * | 9/1996 | Moller et al. ................ | 361/683 |
| 5,621,618 A | * | 4/1997 | Komiyama ................ | 361/732 |
| 6,085,974 A | * | 7/2000 | Inoue ........................ | 235/380 |
| 2003/0021084 A1 | * | 1/2003 | Cho et al. .................... | 361/724 |

* cited by examiner

Primary Examiner—Darren Schuberg
Assistant Examiner—Hung Van Duong

(57) ABSTRACT

The present invention discloses a tower network apparatus including a base, user interface port and power port, which are featured by placing the computer bridge port of the user interface port and power port on the bottom of the base. By connecting the computer bridging cable and power cord to the computer bridge port and power port on the bottom of the base, the gravity center of the tower network apparatus can be lowered and thus uneasy to tumble.

4 Claims, 3 Drawing Sheets

TOWER NETWORK APPARATUS

BACKGROUND OF THE INVENTION

1. Field of the Invention

The invention relates to a network apparatus, and particularly to a tower network apparatus.

2. Description of Related Art

The conventional network apparatus can be roughly classified as tower and flat types in terms of the mechanical outlook. The flat type network apparatus occupies lots of desktop room, and in case of wireless gateway products, if it is designed to have hidden antenna, it must be able to receive signals from all direction. Therefore, it is not appropriate to use the flat type network apparatus. On the contrary, the tower apparatus in use will have the drawback of easily tumbling down due to unsteady balance. One solution is to provide a base to lower its gravity center, while this method tends to increase product cost and not be portable.

In addition, no matter it is a tower type or flat type network apparatus, they all place the user interface port and power port on the side or back of the apparatus, making users no way to plan cabling paths in advance when plugging or unplugging power cable and thus easily mixing up power cables. The consequence not only makes a mess on desk top, but also causes the inconvenience when user plugs/unplugs. Above all, for operating environment of home consuming products, the limited space will generate a lot of viewing discomfort, adding that desk top is already piled up with many goods.

As mentioned above, however the network apparatus currently in the market only considers if power cable can be fixed and most of them don't consider the requirements from user's side. As such, how to effectively design network apparatus to be more human is practically a very important topics presently.

SUMMARY OF THE INVENTION

The primary objective of the present invention is to provide a tower network apparatus, which is steady in weight balance and uneasy to fall down.

Secondly, the invention targets at providing a tower network apparatus capable of avoiding electric cables interwinded.

Thirdly, the invention targets at providing a tower network apparatus capable of saving desktop room.

To achieve the above objective, the tower network apparatus in the invention includes a base, user interface port and power port, which are featured by placing the computer bridge port of the user interface port and power port on the bottom of the base. By connecting the computer bridging cable and power cord to the computer bridge port and power port on the bottom of the base, the gravity center of the tower network apparatus can be lower and thus uneasy to tumble.

The tower network apparatus in the invention at least possesses the following advantages:

1. As all critical components are installed on the bottom, the weight balance is steady and uneasy to tumble.

2. Electric cable is specifically designed, thus avoiding the disadvantage of conventional apparatus concerning interwinded cables.

3. Save the desktop room and beautify the visual effect.

BRIEF DESCRIPTION OF THE DRAWINGS

The present invention will be described according to the appended drawings in which.

BRIEF DESCRIPTION OF THE DRAWINGS

Figure 1:
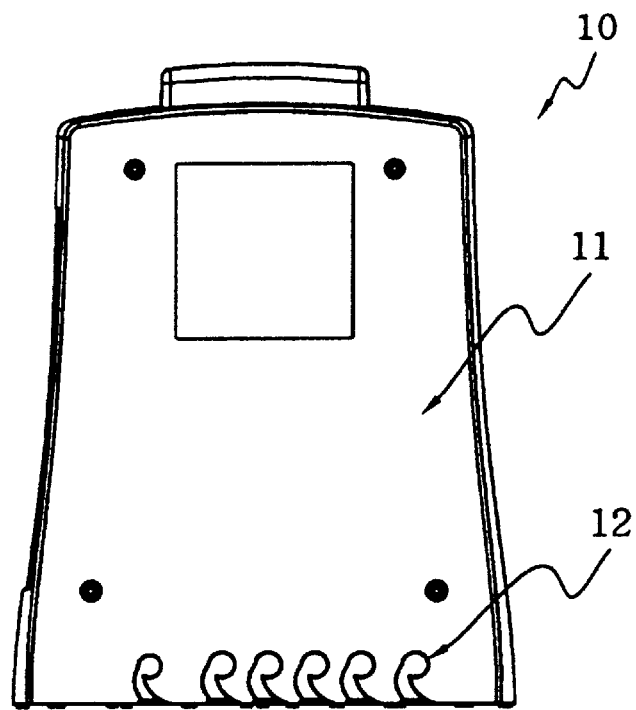
FIG. 1 shows a front side view of a tower network apparatus according to the invention.

FIG. 1 shows the front side view of the tower network apparatus 10 of the invention, including a base 11, user interface port and power port (not shown). For general network products, user interface ports include a printer port, a USB port, an RJ 11 port, an RJ 45 port and COM port. With respect to the above user interface ports, the most frequently used ports are the RJ 45 port as computer bridging port and USB port and RJ 45 port ranks the highest in particular as the currently common interfaces for all LAN and WAN. As RJ 45 port and power port are the parts used by most users of the tower network apparatus, the invention puts the RJ 45 port and power port on the bottom of the tower network apparatus 10, not only lowering the gravity center of the tower network apparatus 10 but also making the tower network apparatus 10 more steady and uneasy to tumble by means of the connection of the RJ 45 cable and power cord to RJ 45 port and power port. The plurality of R-type guiding part 12 located on the bottom of the front side of the base 11 are used to fasten the RJ 45 cable and power cords extending from the RJ 45 port and power port so that all electric cables can be lined up in order, and user can easily find out the corresponding port of each cable to have quick plug/insert, avoiding the cable entanglement disadvantage in the conventional apparatus.

Figure 2:
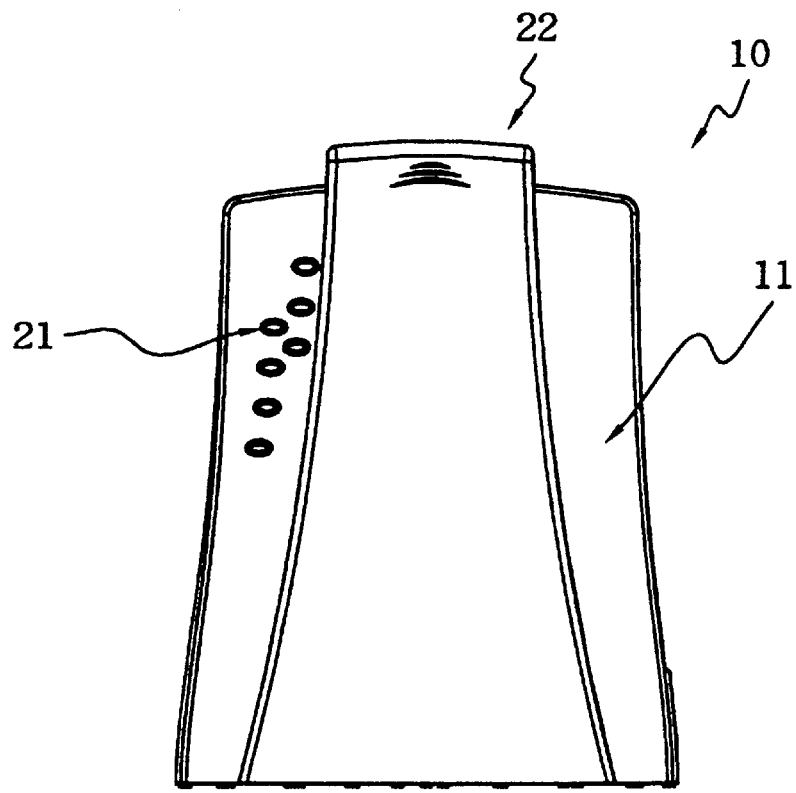
FIG. 2 shows a rear side view of a tower network apparatus according to the invention.

FIG. 2 shows the rear side view of the tower network apparatus 10 of the invention. To increase the stability and heat dissipation ability of the tower network apparatus 10 of the invention, the back of the base 11 can be added a backplane support 22 and a plurality of cooling holes 21.

Figure 3:
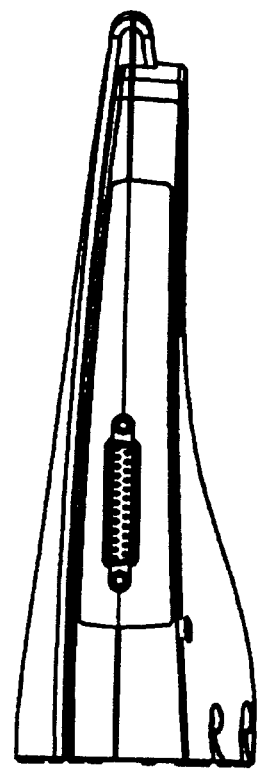
FIG. 3 shows a right side view of a tower network apparatus according to the invention.

FIG. 3 shows a right side view of the tower network apparatus of the invention. The invention places the frequently used RJ 45 port on the bottom of the base 11, and the rest of less frequently used user interfaces, such as printer port 31, USB port, RJ 11 port and COM port and so on, are all placed on the side or back of the base 11 to save the usable area of the bottom of the base 11.

Figure 4:
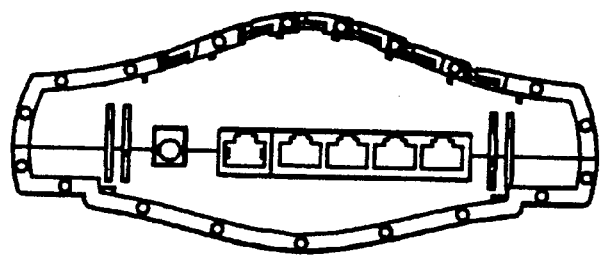
FIG. 4 shows a bottom side view of a tower network apparatus according to the invention.

FIG. 4 shows a bottom side view of the tower network apparatus 10 of the invention, in which the base 11 of the tower network apparatus 10 includes a power port 41 and a plurality of RJ 45 ports 42.

Figure 5:
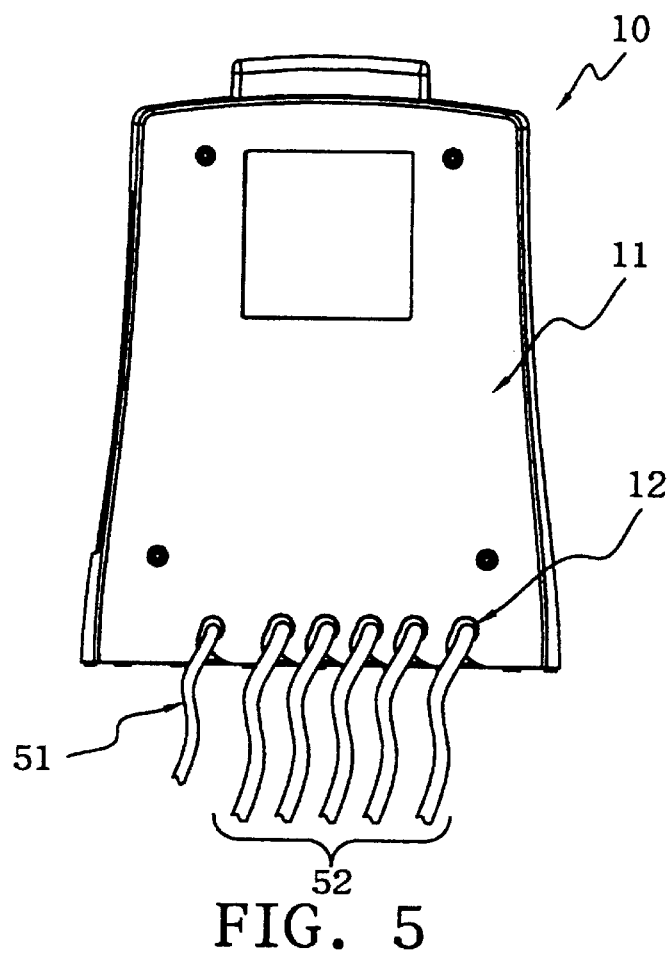
FIG. 5 shows a front side view of cables of a tower network apparatus according to the invention.

FIG. 5 shows a front side view of the tower network apparatus 10 after connecting electric cables. Through the guiding and fixing capabilities of the plurality of R-type guiding part 12, the RJ 45 cable 52 and power cord 51 connected to the RJ 45 and power port can be orderly arranged in parallel on the table without affecting the overall desktop appearance.

Figure 6:
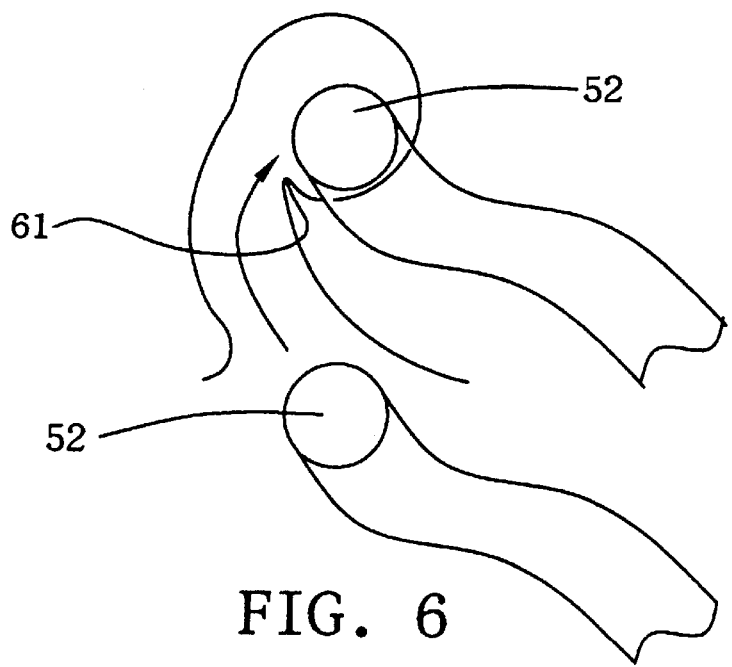
FIG. 6 shows a positive view of R-type guiding parts of a tower network apparatus according to the invention.

FIG. 6 shows a front side view of the R-type guiding part 12 of the tower network apparatus. The R-type guiding part 12 is featured as having an arc guiding structure to allow easy access of hole 62 when user is plugging/inserting RJ 45 cable. When RJ 45 cable 52 is been entered the hole 62, it is only necessary to lift the RJ 45 cable up to a position higher than the jut 61 so that the RJ 45 cable 52 can be easily fastened to the hole 62. When RJ 45 cable 52 is taken out of the hole 62, it is only necessary to lift up the RJ 45 cable 52 up to a position higher than the jut 61 so that the RJ 45 cable 52 can be readily removed from the hole 62.

The above-described embodiments of the present invention are intended to be illustrative only. Numerous alternative embodiments may be devised by those skilled in the art without departing from the scope of the following claims.

What is claimed is:

1. A tower network apparatus comprising a base, at least one user interface port and a power port, characterized in that said at least one user interface port includes a computer bridge port and a power port which are placed on a bottom of said base;

whereby a connection from a computer bridging cable and a power cord to said computer bridge port and power port placed on said bottom of said base can lower a gravity center of said tower network apparatus and make said tower network apparatus uneasy to tumble.

2. The tower network apparatus of claim 1, wherein said computer bridge port is an RJ 45 port or a USB port.

3. The tower network apparatus of claim 1, wherein a plurality of R-type guiding parts are beneath said base for fastening said computer bridging cable and power cord.

4. The tower network apparatus of claim 3, wherein said R-type guiding parts include a jut and a hole, and said jut is used to lead said computer bridging cable and power cord to enter or remove from said hole.

* * * * *